(12) United States Patent
Park

(10) Patent No.: US 6,946,388 B1
(45) Date of Patent: Sep. 20, 2005

(54) METHOD FOR FABRICATING SEMICONDUCTOR DEVICES

(75) Inventor: Hyung Soon Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 10/998,972

(22) Filed: Nov. 30, 2004

(30) Foreign Application Priority Data

Apr. 7, 2004  (KR) ...................... 10-2004-0023659

(51) Int. Cl.⁷ .......................................... H01L 21/44
(52) U.S. Cl. ...................... 438/633; 438/637; 438/674; 438/675
(58) Field of Search ................ 438/633, 637, 438/674, 675

(56) References Cited

U.S. PATENT DOCUMENTS

| | | | |
|---|---|---|---|
| 6,376,386 B1 * | 4/2002 | Oshima | ...................... 438/714 |
| 6,794,244 B2 * | 9/2004 | Mizutani et al. | ............. 438/253 |
| 6,849,539 B2 * | 2/2005 | Ueda | ........................... 438/637 |
| 2002/0155699 A1 * | 10/2002 | Ueda | ........................... 438/637 |
| 2003/0054622 A1 * | 3/2003 | Yamamura | ................... 438/586 |
| 2003/0064578 A1 * | 4/2003 | Nakamura et al. | ........... 438/627 |
| 2004/0009655 A1 * | 1/2004 | Jung | ........................... 438/622 |
| 2004/0266177 A1 * | 12/2004 | Tanaka et al. | .............. 438/637 |

* cited by examiner

*Primary Examiner*—Alexander Ghyka
(74) *Attorney, Agent, or Firm*—Heller Ehrman LLP

(57) ABSTRACT

A method for fabricating semiconductor devices is disclosed, the method including forming a landing plug on a lower interlayer insulating film, successively depositing an upper interlayer insulating film and a nitride film, forming a bit line contact hole, depositing a conductive layer for a contact plug, and forming a contact plug through a CMP process.

8 Claims, 5 Drawing Sheets

METHOD FOR FABRICATING SEMICONDUCTOR DEVICES

BACKGROUND OF THE INVENTION

1. Field of the Invention

The present invention generally relates to a method for fabricating semiconductor devices, and more specifically, to a method for fabricating semiconductor devices, wherein a defect generated in a subsequent process are inhibited by minimizing the loss of a barrier metal layer of a bit line contact plug, and increases in contact resistance and bit line capacitance are a prevented to improve a process yield and reliability of the device.

2. Description of the Related Art

Recent trend in high integration of semiconductor devices is largely affected by development of a microscopic pattern formation technology. The miniaturization of a photoresist pattern, which is widely used as an etching mask or an ion-implant mask during the fabrication of a semiconductor device, is required.

A method wherein a phase shift mask ("PSM") is used as a photo mask, a contrast enhancement layer ("CEL") method, wherein a separate thin film is formed over a semiconductor substrate, a Tri-layer photoresist ("TLR") method, wherein an interlayer film such as a spin on glass ("SOG") is disposed between two photoresist films, and a Silylation method, wherein a silicon is selectively implanted onto the upper surface of a photoresist film are methods for pattern miniaturization for improving the resolution.

In addition, a contact hole connecting the lower and upper conductive wirings has a design rule larger than that of the line/space patterns. As the integration density of semiconductor devices is increased, the dimension of wirings and a space therebetween are decreased. The aspect ratio of the contact hole, which is the ratio of a diameter to a depth thereof, is increased. Therefore, a highly integrated semiconductor device including multi-layer conductive wirings requires the accurate alignment of masks during a formation process of a contact hole, thereby performing the process with a reduced process margin or without a process margin.

The masks are manufactured considering factors such as a misalignment tolerance in a mask alignment between holes, a lens distortion in a lithography process, a critical dimension variation and in a photolithography process, and a registration between masks to maintain space between contact holes.

Methods for formation of the contact hole as described above, include a direct etching method, a method using sidewall spacers and a SAC method.

The direct etching method and the method using sidewall spacers cannot be applied to fabrication of a semiconductor device having a design rule below 0.3 $\mu$m, which the limits highly integration of devices.

In addition, the SAC method designed for overcoming a limit of a lithography process during forming a contact hole can be classified according to the material used as an etch barrier layer such as a polysilicon film, a nitride film, or an oxynitride film. Among these materials, using a nitride film as the etch barrier film is widely used.

Although not shown, a method for fabricating a semiconductor device including a bit line contact having a landing plug according to a prior art will now be described.

First, a lower structure such as a device isolation oxide film, and MOSFET comprising a gate oxide film pattern, a gate electrode layer pattern and a hard mask layer pattern overlapping the gate electrode pattern are formed. An insulating film spacer consisting of a nitride film is then formed on a sidewall of the hard mask layer pattern and the gate electrode.

Next, a planarized lower interlayer insulting film is deposited over the entire surface of the resulting structure. The lower interlayer insulating film is patterned via a photolithography process using a landing plug mask to form a landing plug contact hole. Subsequently, a conductive layer for landing plug filling the contact hole is formed over the entire surface of the structure and then etched to form an electrically isolated landing plug.

Thereafter, an upper interlayer insulating layer is deposited over the entire surface of the structure. A predetermined portion of the upper interlayer insulating layer where a bit line contact is to be formed is removed to form a bit line contact.

Next, a Ti/TiN layer, which is a barrier metal film, and a W layer for a plug material are sequentially deposited over the entire surface of the structure to fill up the bit line contact hole, and then etched back to form a bit line contact plug.

In accordance with the conventional method for fabricating a semiconductor device, the barrier metal layer in the bit line contact hole is severely damaged during an etch-back process of the barrier metal film after the etch process of the W film for forming a bit line contact plug as shown in FIGS. 1 through 3. An electric short circuit may occur due to the damage to a seam at the center of the W layer. Moreover, a bit line capacitance is increased, thereby degrading the process yield and reliability of the device.

Furthermore, defect generation is accelerated in a device having design rule below 0.1 $\mu$m because the thickness of the barrier metal layer is at least greater than 30% of a contact plug.

According to the above-described prior art, a polymer on a sidewall of the W layer is ruined during an etching process due to oxygen within the interlayer insulating film since the W layer is formed on an interlayer insulating film including an oxide film. As shown in FIG. 4, the bottom of a bit line is formed with a negative slope, whereby there is another problem of increasing resistance of a bit line or causing a pattern having defects.

SUMMARY OF THE INVENTION

Accordingly, it is an object of the present invention to minimize damage to a barrier metal layer, thereby inhibiting characteristics of a semiconductor device from deteriorating due to an electric short circuit or an increase in capacitance of a bit line.

In order to achieve the above object according to an embodiment of the present invention, there is provided a method for fabricating a semiconductor device comprising the steps of (a) forming an interlayer insulating film including a landing plug on a semiconductor substrate having a predetermined lower structure;

(b) depositing a nitride film on the interlayer insulating film, the nitride film having an etch selectivity different from that of the interlayer insulating film;

(c) etching the insulating film via a photolithography process using a contact mask to form a contact hole;

(d) sequentially forming a barrier metal layer and a conductive layer for contact plug on the semiconductor substrate;

(e) performing a CMP process to etch the conductive layer for contact plug and the barrier metal layer, whereby a contact plug filling the contact hole is formed;

(f) depositing a conductive layer for bit line on the surface of the semiconductor substrate; and (g) forming a bit line by etching the conductive layer for bit line.

DETAILED DESCRIPTION OF THE EXEMPLARY EMBODIMENTS

Figure 1:
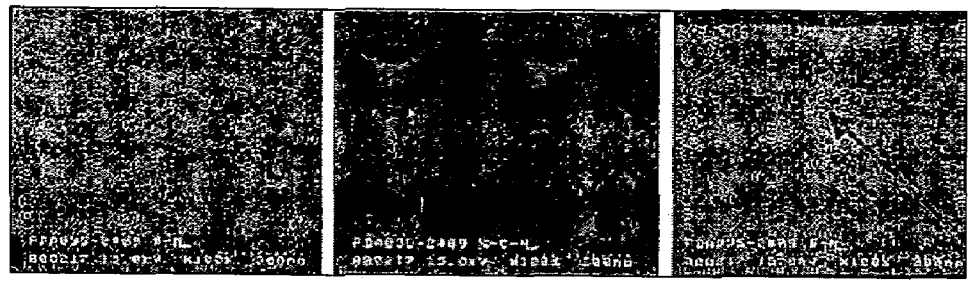
FIG. 1 is a SEM photo illustrating a semiconductor device according to a prior art.
Figure 2:
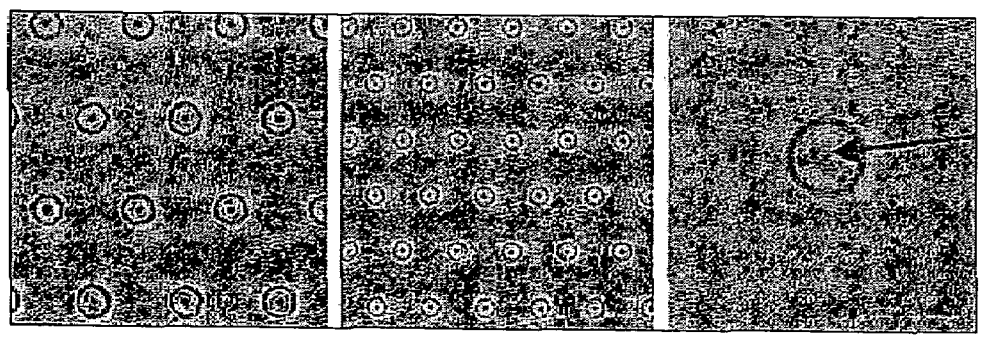
FIG. 2 is a CD-SEM photo illustrating a semiconductor device according to a prior art.
Figure 3:
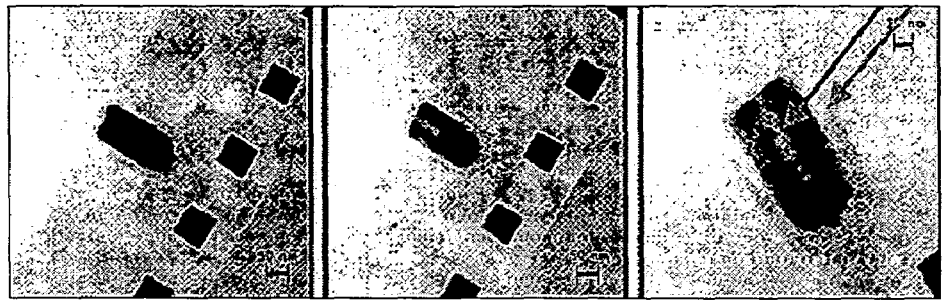
FIG. 3 is a TEM photo illustrating a semiconductor device according to a prior art.
Figure 4:
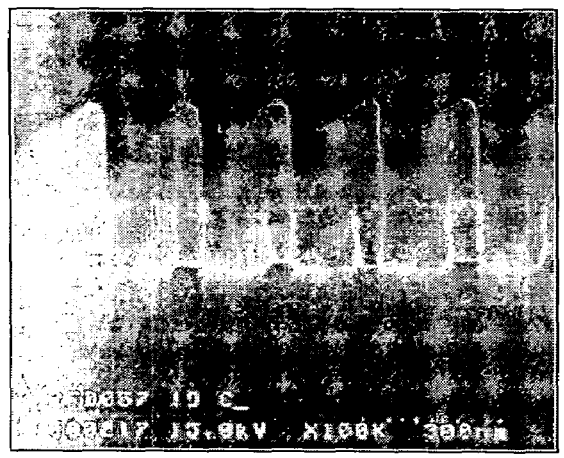
FIG. 4 is a SEM photo after formation of a bit line in a semiconductor device according to a prior art.

A method for fabricating semiconductor devices in accordance with an embodiment of the present invention will now be described in detail with reference to the accompanying drawings. Wherever possible, the same reference numerals will be used throughout the drawings to refer to the same or like parts.

FIGS. 5a through 5e are cross-sectional views illustrating a method for fabricating semiconductor device in accordance with the present invention, and show an exemplary bit line contact having a landing plug.

Figure 5A:
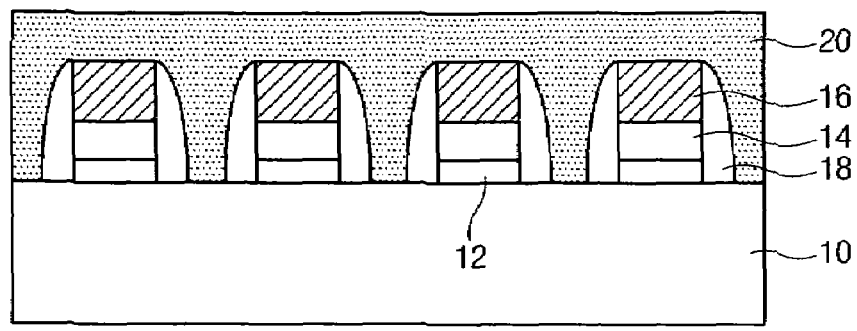
FIGS. 5a through 5e are cross-sectional views illustrating a method for fabricating semiconductor devices according to the present invention.

Referring to FIG. 5a, a stacked structure of a gate oxide film for MOSFET (not shown), a gate electrode layer (not shown) and a hard mask layer (not shown) is formed on a semiconductor substrate 10. Thereafter, the stacked structure is etched to form a gate. Here, the gate comprises a stacked structure of a gate oxide film pattern 12, a gate electrode 14, and a hard mask layer pattern 16. Next, an insulating spacer 18 comprising a nitride film is formed on a sidewall of the gate. A planarized lower interlayer insulating film 20 is then deposited over the entire surface of the resulting structure. Here, the hard mask layer pattern 16 preferably comprises a nitride material for preventing the damage to the gate and the short circuit generated in the subsequent process. The gate electrode layer pattern 14 comprises a low resistance structure such as a polycrystalline silicon layer having a tungsten layer or tungsten silicide layer thereon. In order to pattern the structure, a thickness of the hard mask layer pattern 16 is increased, thereby increasing the aspect ratio of the gate. In addition, an etch barrier layer (not shown) may further be formed before formation of the lower interlayer insulating film 20.

Figure 5B:
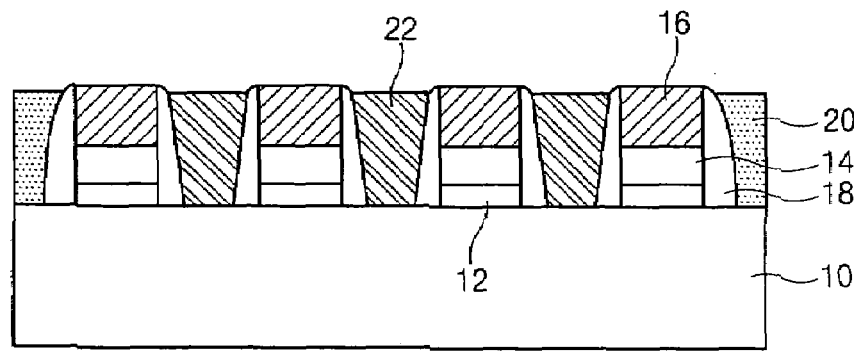

Referring to FIG. 5b, the lower interlayer insulating film 20 is patterned via a photolithography and etching process using a landing plug mask to form a landing plug contact hole. A conductive layer for landing plug filling the landing plug contact hole is deposited over the entire surface of the resulting structure, and then planarized via an etch-back process a CMP process to form a landing plug 22.

Figure 5C:
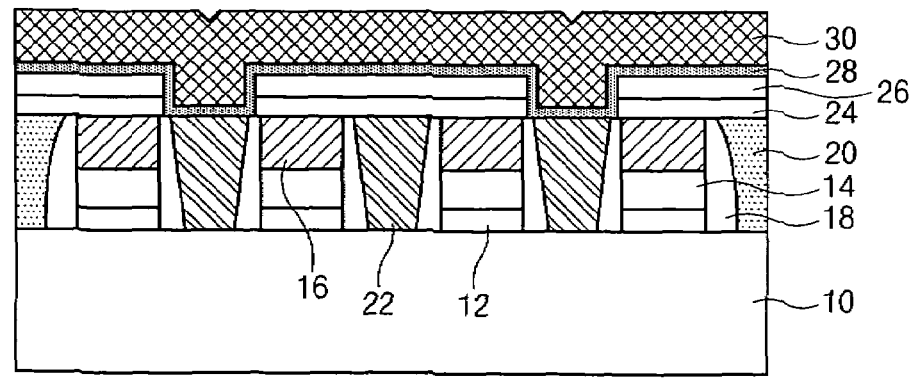

Referring to FIG. 5c, an upper interlayer insulating film 24 is deposited over the entire surface of the resulting structure. An etch barrier layer 26 for CMP process is formed on the upper interlayer insulating film 24. The etch barrier layer 26 comprises a nitride film material, for example $Si_3N_4$ or $SiO_xN_y$. Preferably, the thickness of the upper interlayer insulating film pattern 24 ranges from 1000 Å to 2000 Å. The upper interlayer insulating film pattern 24 comprises an Undoped Silicate Glass ("USG") film. The thickness of the etch barrier layer pattern 26 ranges from 1000 Å to 2000 Å. The etch barrier layer pattern 26 comprises a nitride film such as $Si_3N_4$ and SiON.

A predetermined portion of the etch barrier layer 26 and the upper interlayer insulating film where a bit line contact is to be formed is sequentially removed via a photolithography and etching process using a contact mask to form a bit line contact.

Thereafter, a barrier metal layer 28, which comprises Ti, TiN or a stacked structure of Ti/TiN, and a tungsten layer 30 for landing plug material is sequentially deposited over the entire surface of the structure to fill the bit line contact hole.

Figure 5D:
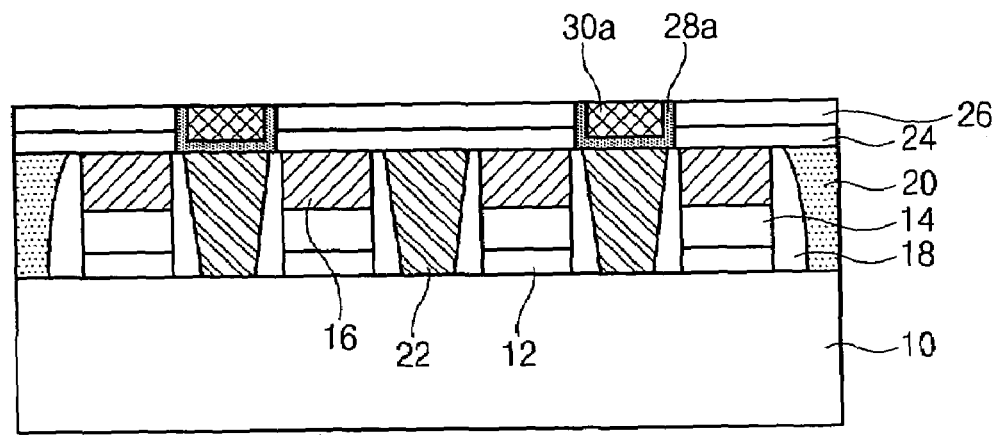

Referring to FIG. 5d, the tungsten layer 30 and the barrier metal layer 28 is sequentially etched via a CMP process to form a bit line contact plug consisting of a tungsten layer pattern 30a and a barrier metal layer pattern 28a.

The CMP process is preferably performed using a slurry for oxide film including an additive instead of that for metal layer. A barrier for the CMP process is formed by the etch barrier layer pattern 26, and the damage to a metal layer is minimized.

In addition, the slurry for oxide film preferably has a pH ranging from 1 to 9, and is a collided $SiO_2$ type. The slurry may comprise $H_2O_2$ solution ranging from 0.5 wt % to 8 wt % or a citric acid ranging from 0.01 wt % to 10 wt %.

Figure 5E:
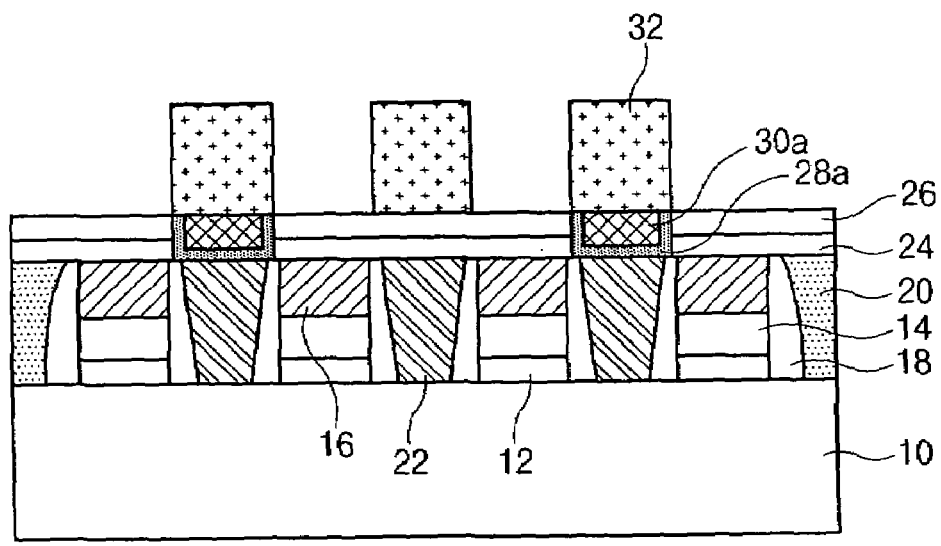

Referring to FIG. 5e, a conductive layer 32 for a bit line including tungsten is formed over the entire surface of the resulting structure. The conductive layer 32 is then patterned via a photolithography and etching process using bit line mask to form a bit line. Herein, the etch barrier layer pattern 26 prevents the tungsten layer pattern 30a from being etched with a negative slope.

Preferably, the etching process is performed under a chamber pressure ranging from 5 mTorr to 10 mTorr. A $N_2O$ plasma treatment may be performed after formation of the bit line. In addition, after formation of the bit line, a surface treatment may also be performed using $Cl_2$ gas having a flow rate ranging from 10 sccm to 50 sccm and $SF_6$ gas having a flow rate ranging from 5 sccm to 50 sccm. The ratio of $Cl_2$ to $SF_6$ preferably ranges from 1:1 to 1:3.

In accordance with the above-described embodiment a sacrifice layer is formed on the upper interlayer insulating film. However, only the sacrifice layer without the upper interlayer insulating film may be deposited to form a bit line contact hole.

Figure 6:
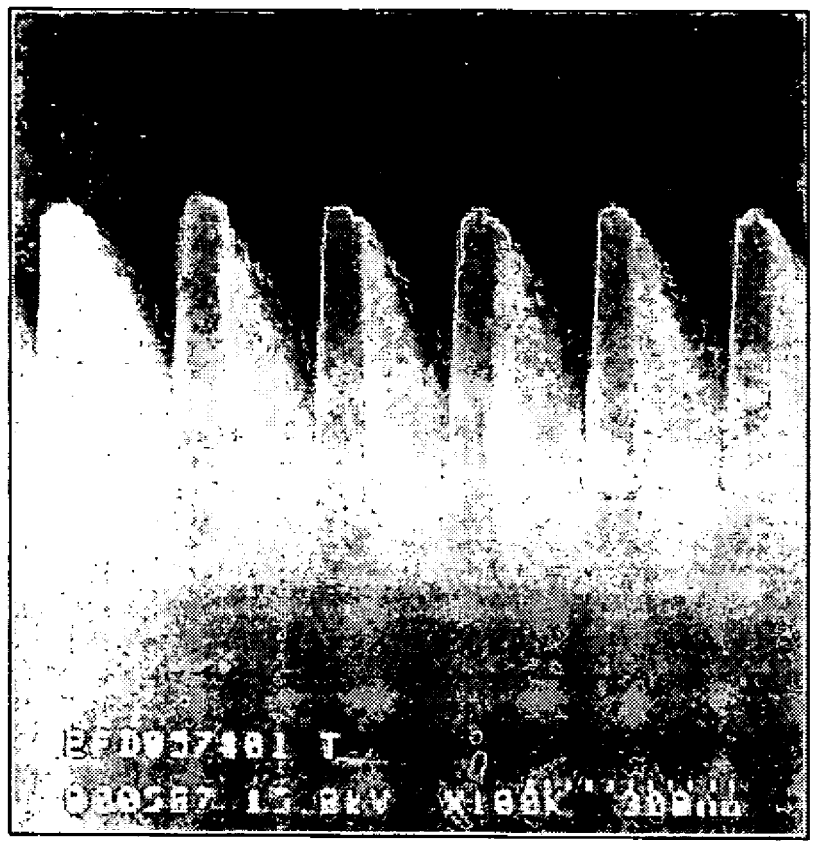
FIG. 6 is a TEM photo illustrating a semiconductor device according to the present invention.

As described above, in accordance with method for fabricating semiconductor devices of the present invention, the nitride film services as a CMP barrier, minimizing the damage to a barrier metal layer. As shown in FIG. 6, the damage to the metal barrier layer of the contact plug is compensated, thereby inhibiting a short circuit and an increase in resistance of a bit line. In addition, the damage to the bottom of the tungsten layer for a bit line is avoided due to the nitride film. As a result, a defective pattern, an increase in resistance of a bit line and void can be prevented.

As the present invention may be embodied in several forms without departing from the spirit or scope thereof, it should also be understood that the above-described embodiments are not limited by any of the details of the foregoing description. Rather the present invention should be construed broadly as defined in the appended claims. All changes and modifications that fall within the metes and bounds of the claims, or equivalences of such metes and bounds are intended to be embraced by the appended claims.

What is claimed is:

1. A method for fabricating semiconductor devices, comprising the steps of:
   (a) forming an interlayer insulating film including a landing plug on a semiconductor substrate having a predetermined lower structure;
   (b) depositing a nitride film on the interlayer insulating film, the nitride film having an etch selectivity different from that of the interlayer insulating film;
   (c) etching the insulating film via a photolithography process using a contact mask to form a contact hole;
   (d) sequentially forming a barrier metal layer and a conductive layer for contact plug on the semiconductor substrate;
   (e) performing a CMP process to etch the conductive layer for contact plug and the barrier metal layer, whereby a contact plug filling the contact hole is formed;
   (f) depositing a conductive layer for bit line on the surface of the semiconductor substrate; and
   (g) forming a bit line by etching the conductive layer for bit line.

2. The method according to claim 1, wherein the interlayer insulating film comprises an Undoped Silicate Glass (USG) film.

3. The method according to claim 1, wherein a thickness of the interlayer insulating film ranges from 1000 Å to 2000 Å.

4. The method according to claim 1, wherein a thickness of the nitride film ranges from 1000 Å to 2000 Å.

5. The method according to claim 1, wherein the etching process of the step (e) is performed under a chamber pressure ranging from 5 mTorr to 10 mTorr.

6. The method according to claim 1, further comprising subjecting the bit line to a $N_2O$ plasma treatment.

7. The method according to claim 1, further comprising subjecting the bit line to a surface treatment using $Cl_2$ gas having a flow rate ranging from 10 sccm to 50 sccm and $SF_6$ gas having a flow rate ranging from 5 sccm to 50 sccm.

8. The method according to claim 7, wherein the ratio of $Cl_2$ to $SF_6$ is in a range of about 1:1 to about 1:3.

* * * * *